United States Patent [19]

Spanton

[11] Patent Number: 5,207,350
[45] Date of Patent: May 4, 1993

[54] SYSTEM FOR LOADING SEMICONDUCTOR PACKAGE TESTER

[75] Inventor: Lawrence E. Spanton, San Jose, Calif.
[73] Assignee: VLSI Technology, Inc., San Jose, Calif.
[21] Appl. No.: 786,192
[22] Filed: Oct. 31, 1991
[51] Int. Cl.⁵ .......................................... G07F 11/12
[52] U.S. Cl. .................................. 221/105; 221/95; 221/103; 221/109; 209/573; 198/435
[58] Field of Search ............... 221/95, 103, 104, 105, 221/108, 109, 130, 131, 133, 194, 287, 300, 301; 414/414, 425; 209/573; 324/158 F; 198/435; 193/2 R

[56] References Cited

U.S. PATENT DOCUMENTS

| | | | |
|---|---|---|---|
| 2,921,663 | 1/1960 | Parker | 198/435 |
| 3,580,141 | 5/1971 | Richter | 198/435 X |
| 3,606,942 | 9/1971 | Daniels et al. | 198/435 |
| 4,222,166 | 9/1980 | Kurek et al. | 221/301 X |
| 4,573,606 | 3/1986 | Lewis et al. | 221/3 X |
| 4,867,299 | 9/1989 | Fukuoka et al. | 198/435 |

OTHER PUBLICATIONS

Aseco Corporation, "Model 3000 Automatic Lead Inspection System," 1991.

*Primary Examiner*—Robert P. Olszewski
*Assistant Examiner*—Dean A. Reichard
*Attorney, Agent, or Firm*—Majestic, Parsons, Siebert & Hsue

[57] ABSTRACT

An apparatus for loading devices into a semiconductor tester is disclosed. The tester has an input track for accepting devices. The apparatus includes a number of elongated tracks for holding a plurality of semiconductor devices. Each elongated track has at its input end a stop hinge for connection to a tube for holding the semiconductor devices. Each elongated track has at its output end a gate for controlling the release of devices onto the input track of the tester from the elongated track. A control circuit controls the operation of the gates so that the devices can be loaded from the elongated tracks onto the input track of the tester sequentially.

13 Claims, 3 Drawing Sheets

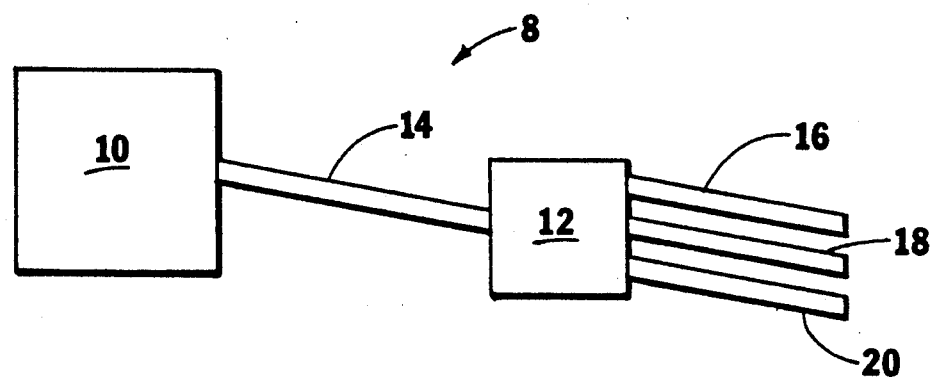
FIG._1.
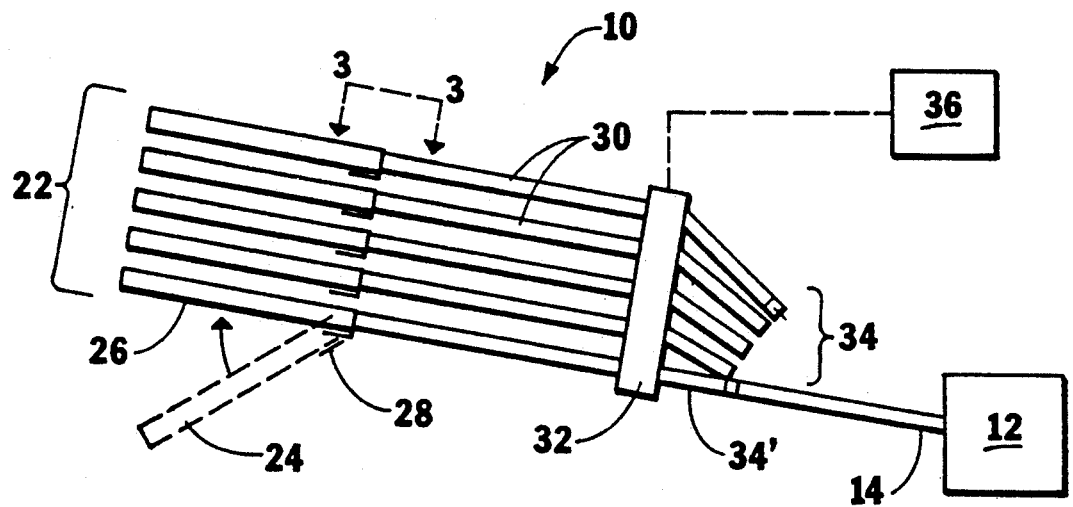
FIG._2.

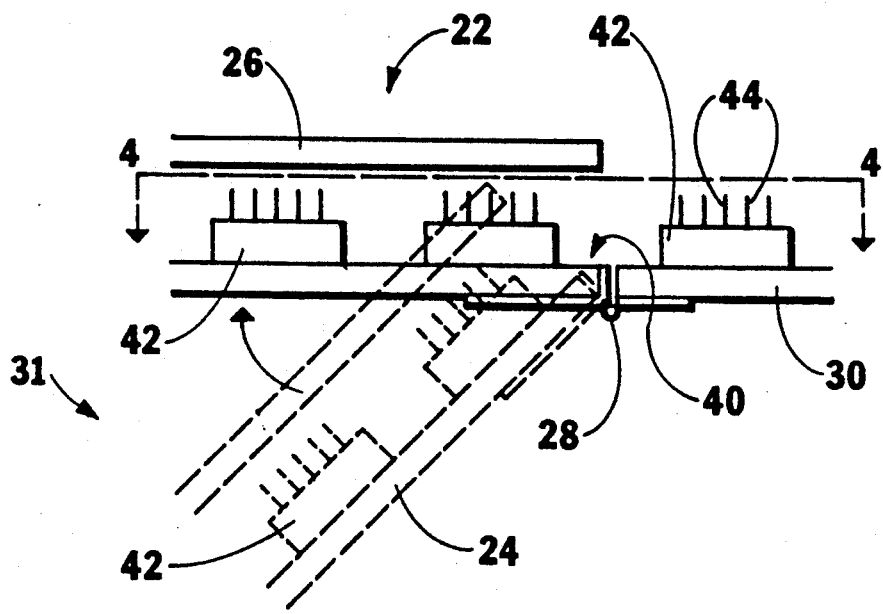
FIG._3.
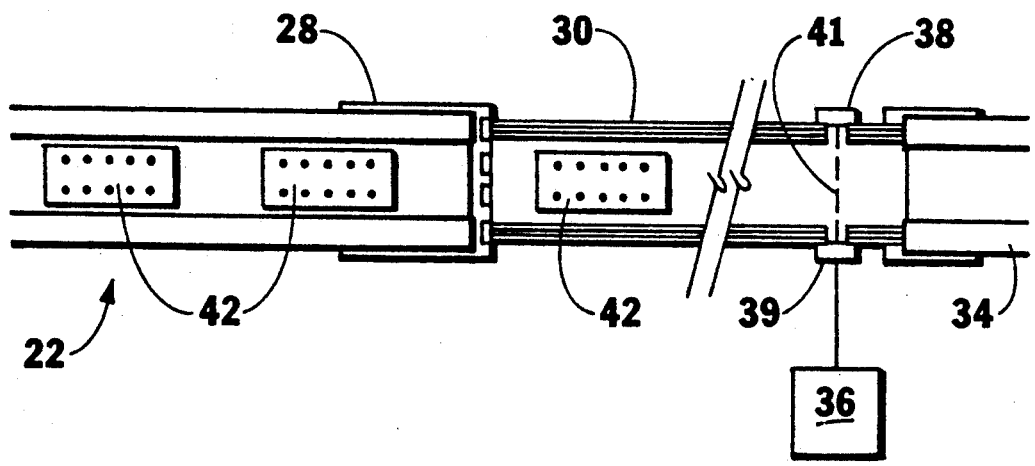
FIG._4.

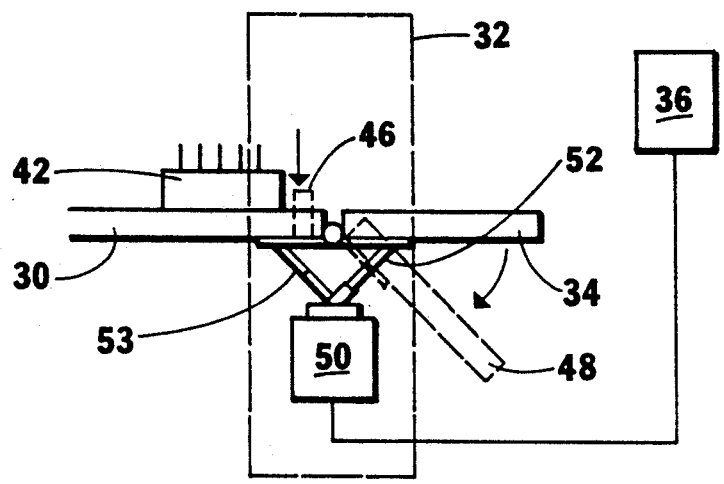
FIG._5.
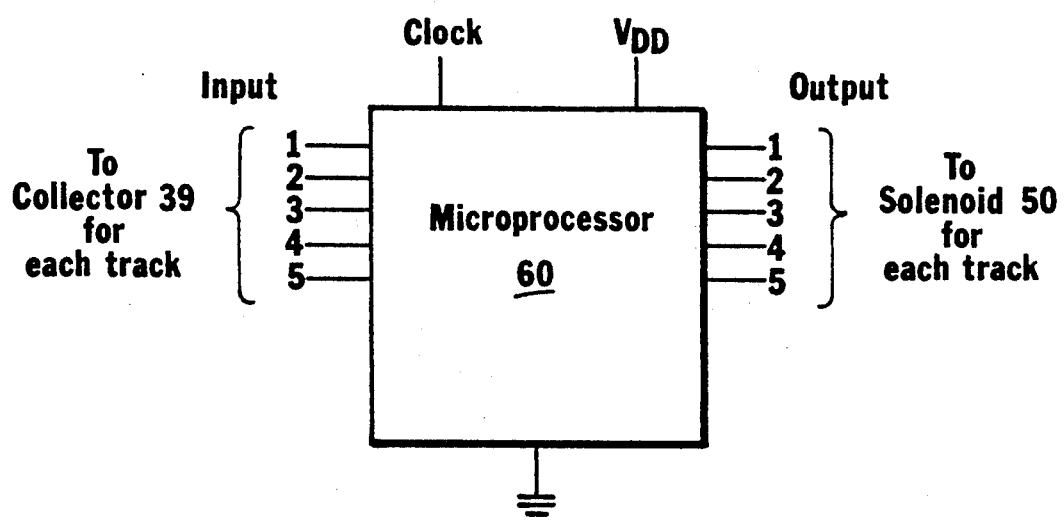
FIG._6.

SYSTEM FOR LOADING SEMICONDUCTOR PACKAGE TESTER

BACKGROUND OF THE INVENTION

This invention relates to a novel tube loader for use with a semiconductor testing system. More specifically, this invention relates to a tube loader which increases the speed at which semiconductor devices may be input to an inspection station, thereby making the system more efficient.

After fabrication, semiconductor chip packages such as plastic lead chip carriers (PLCC) are often inspected by testing machines to insure that each finished package conforms to performance standards. One such testing machine is a lead inspection station which determines whether the leads on individual chips are properly fabricated, and detects other defects such as lead deformities. Other tests include those which test electrical properties, determine lead pitch accuracy and inspect lead coplanarity. In this type of testing system, packages are loaded into the testing machine and an optical scanner determines whether the devices are properly fabricated. Each device is individually scanned and then a pick and place machine loads the device onto one of a multiplicity of output tracks. For example, there may be three output tracks so that the devices may be separated according to whether the device is qualified as bad, marginal, or good by the inspection station.

The packages or devices under test (DUT) are usually transported and handled in clear elongated tubes. The tubes are rectangular in cross-section, and the packages are positioned in a single row along the length of a tube. The tubes are capped at both ends during transport to prevent the devices from sliding out of the tubes. In the past, the devices have been input to the testing system by feeding them from a loading tube into the inspection station along a single input track. An operator monitors the inspection station and feeds the devices into the station via the loading track one tube at a time. The efficiency of testing systems is thus limited by the speed at which the devices are loaded onto the loading track.

The difficulties suggested in the preceding are not intended to be exhaustive but rather are among many which may tend to reduce the efficiency of prior art testing stations. Other noteworthy problems may also exist; however, those presented above should be sufficient to demonstrate that semiconductor testing stations appearing in the past will admit to worthwhile improvement.

It is therefore a general object of the invention to enhance the effectiveness of prior art semiconductor testing systems.

It is a specific object of the invention to provide a device which increases the speed at which devices may be loaded onto a prior art semiconductor inspection station.

It is another object of the invention to provide a device which minimizes the amount of time which an operator must monitor the semiconductor inspection stations of the prior art.

It is still another object of the invention to provide a device which decreases the overall time required to test and inspect a predetermined number of devices.

SUMMARY OF THE INVENTION

One aspect of the invention which accomplishes the foregoing objects includes an apparatus for loading devices into a semiconductor tester which tests a plurality of devices. The tester has an input track for accepting the devices. The novel apparatus includes a plurality of elongated tracks for holding a plurality of semiconductor devices. The apparatus also includes means for positioning the devices on the input track of the tester. A control means controls the operation of the apparatus and the positioning means to permit the devices to move from the elongated track onto the input track of the tester.

DESCRIPTION OF THE DRAWINGS

Other advantages of the present invention will become apparent from the following detailed description of a preferred embodiment thereof taken in conjunction with the accompanying drawings, wherein:

FIG. 1 is a block diagram depicting a testing system comprising an inspection station and the tube loader of the present invention;

FIG. 2 is a detailed side elevational view depicting the tube loader and the inspection station;

FIG. 3 is a cross-sectional view as taken along line 3—3 in FIG. 2 showing the connection of an input tube to a portion of the tube loader of the present invention;

FIG. 4 is a cross-sectional view as taken along line 4—4 in FIG. 3;

FIG. 5 is a detailed cutaway side elevational view of the gating mechanism of the present invention; and FIG. 6 is a diagram illustrating the control system of the present invention.

DETAILED DESCRIPTION OF THE INVENTION

Referring now to the drawings, wherein like numerals indicate like parts, and initially to FIG. 1, there will be seen a block diagram of a testing system 8 having a tube loader 10 of the present invention connected to an inspection station 12 via a loading track 14. Devices are loaded into the inspection station 12 from the tube loader 10 along the single loading track 14. As mentioned above, the inspection station may be used to determine the presence of lead deformities or other fabrication flaws. The devices are sorted by the inspection station and each device is then output to either track 16, 18, or 20. For example, track 16 may receive "good" devices, track 18 "marginal" devices, and track 20 "bad" devices. Each of the output tracks is connected to an elongated tube (not shown) such that after each output track 16-20 is filled, the devices on that particular track are loaded into elongated shipping tubes (not shown) and removed from the testing system 8. The output elongated tubes are the same as those used to input the devices to the testing system and are shown in FIG. 2, labeled 22.

FIG. 2 shows a side elevational view of the tube loader 10 of the present invention connected to the loading track 14, which is integrally attached to the testing station 12. FIG. 2 is a simplified diagram and illustrates the major components of the novel apparatus 10 of the present invention. As discussed above, devices are commonly transported in elongated tubes which are generally labelled 22. In the instant embodiment there are five tubes 22 shown which are usually sequentially attached to the tube loader 10. A two-position stop hinge 28 on each of the input tracks connects and secures the tubes to the track. More specifically, the phantom line first loading position 24 of a single tube is shown prior to being positioned in a working solid line position 26 adjacent to the tube loader. The tube is manually pushed upward to eventually lock into the solid line second working position 26. The input tracks defined by the input tubes 22 are vertically coplanar in order to conserve space and enhance operation of the tube loader as described more fully below. In use, an operator would usually secure the top tube 22 to the tube loader 10 and then sequentially secure the remaining tubes until the last tube at the bottom is put into the working position 26.

The tube loader 10 includes a plurality of loading tracks 30, each corresponding to an input tube 22. The tracks 30 are vertically inclined to permit the force of gravity to passively move the devices down each track from each of the input tubes. A control mechanism 32 at the lower end of the tracks 30 controls the passage of devices from one of the five tracks 30 to the corresponding one of five hinged tracks 34. In the case of the four hinged tracks 34 other than the track 34' at the bottom, one of the four hinged tracks 34 is moved at a time to a position adjacent but not actually connected to the input track 14 during the system operation so that devices may slide from one of the hinged tracks 34 onto the input track 14. In FIG. 2, the bottom one 34' of the five hinged tracks 34 is shown adjacent to and in this particular case actually connected to the input track 14 during the system operation so that devices may slide from the hinged track 34' onto the input track 14.

The control mechanism 32 includes an optical sensor at the lower end of each of the tracks 30; the sensor determines whether there still are devices remaining on each of the tracks 30. The control mechanism also includes a gate for each of the tracks to control passage of devices, and a hinge which connects each of the loading tracks 30 to the corresponding hinged track 34. As described in detail below in reference to FIG. 5, an electrical solenoid controls movement of the hinged tracks 34. An electrical control system 36 is coupled to the control mechanism 32 and controls the operation of this portion of the tube loader. The control system 36 will be described below in conjunction with FIG. 6. The control mechanism 32 will be shown in more detail in FIG. 5. It will be understood that the tube loader may include a different number of input tracks for a corresponding number of input tubes, depending upon the needs of the user.

During system operation, the tubes 22 containing devices are loaded onto each of the tracks. FIG. 3 is a cross sectional view of the juncture between an input tube 22 and the loading track 30 as taken along line 3—3 in FIG. 2. A standard two-position stop hinge 28 aligns and connects the end of a tube 22 to loading track 30.

During installment of the tubes, where the hinge is in the first loading position shown in dotted lines in FIG. 3, the top tube is snapped into place and manually pushed upward until the second working position of the stop hinge 28 is reached as shown in solid line and the tube is held in place. An input tube 24, corresponding to FIG. 2, is shown in phantom prior to being manually pushed upward into the working position 26. The lower tubes are sequentially connected to the tube loader 10 until all tubes are in place. The tube loader 10 then is ready to be used for loading devices onto the input track of the tester.

Devices 42 are shown inside the tube 22 and on the track 30. The tube 22 is rectangular in cross-section and has both a top and a bottom side, but the loading track 30 includes only a lower surface to support the devices 42. The devices 42 have multiple leads 44 thereon.

FIG. 4 is a top cross-sectional view of the tube 22 integrally attached to the loading track 30 as taken along line 4—4 in FIG. 3, and in addition, a simplified top view of control system 36 and a portion of a hinged track 34 and the juncture between the loading track 30 and the hinged track 34. The tube is designed so that the devices 42 are slightly narrower than the tube to permit them to slide freely out of the tube. The devices are snugly positioned adjacent one another to minimize movement in the tube during transport. The stop hinge 28 is shown connecting and aligning the tube 22 and the loading track 30. The loading track 30 is beveled as shown to prevent the devices 42 from sliding off the track when the device is moving down the length of the track. An optical sensor includes a light emitting diode (LED) 38 on track 30 which emits a light signal along a path 41. The light signal is received by a collector 39. When a package 42 crosses the path 41 of the LED, the collector senses that the light signal along the path 41 has been interrupted and the control system 36 is signalled that a package is on the track. If no packages pass between the LED and the collector for a predetermined amount of time, this indicates that no device is present on track 30 or in the tube 22 connected to such track. LEDs 38 and sensors 39 are present on each of the tracks to monitor the presence of devices on all five tracks and all five tubes. When the sensor on one of the tracks 30 indicates that the track and the tube connected thereto are empty, the control system responds to the signal from the sensor by activating a gate controlling a different track 30 and a different hinged track 34 to feed devices from a different tube to the input track 14. Thus, packages are continually fed onto the input loading track 14, until all of the tracks 30 and the tubes 22 connected thereto have been emptied. The control system then indicates to the operator that all of the tubes 22 have been emptied, and that the tube loader 10 needs to be re-loaded using another set of tubes 22 containing devices to be tested. The track is made of a nonabrasive material, such as steel, so that the packages may slide smoothly down the track.

Referring again to FIG. 2, tube 22 is shown attached to track 30. To position the tube adjacent to the track, the tube is hooked onto the stop hinge when the hinge is rotated approximate 45 degree angle downwards to a position below the operating position of the hinge to its first loading position as shown in FIG. 3. The hinge and tube are then manually raised above the stop point of the hinge to lock the tube into place in the second working position locked in place. When the tube 22 is in position, it is elevated above the track 30 so that the devices 42 will slide out of the tube 22 and onto the loading track 30. The bottom surfaces of the tube and of the track are aligned by the stop hinge and the clip mechanism 40 so that the devices may slide smoothly onto the loading track 30. A roller (not shown) or some other device may be employed with the tracks to propel the devices down the track without departing from the scope of the present invention, but no such mechanism is used in this embodiment.

The plurality of input tracks 30 of loader 10 permits an operator to load devices into all of the tracks and then stop monitoring the loading of devices onto the input track of the testing system until the sensors sensing whether any device is present on any one of the five tracks 30 indicate that all of the tracks are now empty and must be reloaded with devices to be tested. The tube loader 10 permits a test system to work more efficiently because an operator may monitor more testing stations than in the prior art.

FIG. 5 shows the control mechanism 32 at the juncture of one loading track 30 and the corresponding hinged track 34. The loading track 30 is connected to the hinged track 34 by a hinge which permits the hinged track 34 to move to a phantom position 48. The hinged track 34 is connected by means of piston mechanism 52 to an electrical solenoid 50 which adjusts the hinged track's angle of incline with respect to the input track 14, to connect a particular hinged track with the input track 14. The solenoid 50 is controlled by the control system 36 and is activated to move the hinged track into the appropriate position to become flush with the input track 14, not shown in this drawing. The solenoid includes a telescoping arm member or piston mechanism 52 which extends and contracts to properly position the adjacent hinged track. The actual working position of each of the hinged tracks may be different and depends on the relative angle between each hinged track and the loading track 14. The amount of extension by the piston arms may be programmed by the control system so that the hinged tracks are properly aligned with the loading track.

The solenoid 50 also controls the vertical movement of a gate 46 which is integrally positioned within the track 30. A second piston mechanism 53 moves the gate up or down in response to a signal from the control system 36. The solenoid coordinates movement of the gate 46 and the hinged track 34 in response to the optical sensor so that the gate is recessed into the track when the packages are to be moved down the corresponding hinged track 34. Once the devices reach the testing station 12, a pick and place device (not shown) moves them through the testing station and onto the output tracks illustrated in FIG. 1. The above described control system including the solenoid, the two piston mechanisms and gate control is present and used for the juncture between each track 30 and its corresponding hinged track 34 for gating the release of devices from each track and its corresponding hinged track onto the input loading track 14. The control system activates the solenoid 50 controlling one of the hinged tracks through piston mechanisms 52, 53 at a time to permit devices on the loading track 30 to be continually loaded onto the input track 14 from the hinged tracks, one hinged track 34 at a time.

The operation of the multiple tube loader 10 may be understood by referring again to FIG. 1. The steps involved in operating the tube loader 10 are: (1) the tubes 22 are manually positioned adjacent to the loading tracks 30, and are at higher elevations so that the devices to be tested slide down the tracks 30 from tubes 22; (2) a hinged track 34 connected to a particular track 30 is positioned adjacent to the scanning input track 14, and the gate at the juncture between them is opened to release the devices from the track 30 onto the hinged track connected thereto; (3) the devices 42 slide down the hinged track and onto the scanning input track 14; (4) the optical sensor 39 on the track 30 from which devices are unloaded detects that no more devices are on this particular track 30 being unloaded and a signal is sent to the control system 36; and (5) the control system activates the appropriate solenoid to close the gate of such unloaded track and activates the solenoid for controlling the next track, thereby moving the next hinged track 34 adjacent the scanning input track and open the corresponding gate 46. The hinged tracks 34 continue to sequentially deliver devices to the scanning input track 14 until the sensor monitoring the last of the tracks in the sequence (e.g. the bottom track if the sequence starts from the top track) indicates that all of the tracks have been unloaded and must be reloaded with tubes containing devices. In this way, many more devices may be continuously fed into the inspection station while minimizing the amount of monitoring an operator must provide.

FIG. 6 illustrates the control system 36 which includes a microprocessor 60. The microprocessor coordinates all automated movement in the tube loader 10. As shown in the diagram, the output signal from the optical sensor 39 of each loading track 30 is input to the microprocessor. The microprocessor then coordinates movement of the gates and hinged tracks 34 by issuing signals to the solenoids 50 controlling the individual tracks. In response to the microprocessor signals, the solenoid adjusts the gate and/or the hinged track by extending or retracting the arm members 52, 53, respectively. The microprocessor controls the tube loader 10 such that packages may be efficiently loaded onto the input track 14. The optical sensors and the solenoid 50 for each track are individually coupled to the microprocessor 60, but it will be understood that the sensors and solenoids may be digitally encoded so that a common bus may be used to connect the elements to one another.

After reading and understanding the foregoing inventive multiple tube loader 10, in conjunction with the drawings, it will be appreciated that several distinct advantages of the subject invention are obtained. Without attempting to set forth all of the desirable features of the instant invention, at least some of the major advantages of the invention include the multiple input tubes 22 which permit a substantial number of devices to be efficiently loaded into an inspection station 12. The increased speed of delivery of devices to the inspection station increases the efficiency of the entire testing system 8. Since the multiple tube loader 10 accommodates more devices than the prior art, the amount of time an operator must monitor the semiconductor testing station is thereby minimized.

It should be noted that although the invention has been described with reference to specific embodiments, it should not be construed to be so limited. For example, actuation mechanisms other than the electrical solenoid 50 may be used to move the tracks 34. Additionally, a mechanism other than the stop hinge 28 may be used to positioned the tubes 22. The optical sensors may be moved from their position over the loading tube to the end of the hinged tracks 34. Those skilled in the art and familiar with the instant disclosure of the subject invention may recognize additions, deletions, modifications, substitutions and other changes which will fall within the purview of the subject invention and claims.

What is claimed:

1. An apparatus for use with a semiconductor tester which inspects a plurality of devices, said tester having an input track for accepting the devices, said apparatus loading devices onto the input track, said apparatus comprising:

a plurality of elongated holding tracks being adapted to hold a plurality of semiconductor devices along said tracks, said plurality of semiconductor devices being contained in a plurality of tubes, with each tube adjacent to and aligned with one of said plurality of elongated holding tracks, said holding tracks including stop hinges, said stop hinges connecting and securing said tubes to said tracks;

means for loading said devices onto said holding tracks;

means for depositing the devices from the holding tracks onto the input track of the tester; and control means for controlling said depositing means to permit the devices to move from said elongated holding tracks onto the input track of the tester.

2. The apparatus as defined in claim 1 wherein said plurality of elongated holding tracks each have a width which is substantially the same as the width of the semiconductor devices contained in the tubes.

3. The apparatus as defined in claim 1 wherein said plurality of holding tracks are positioned separately and are coplanar in a vertical plane, and at an slant such that the devices will slide from the tubes down the holding tracks.

4. The apparatus as defined in claim 1 wherein said holding tracks include smooth surfaces such that the devices may slide down the holding tracks when said holding tracks are in a sloping position.

5. An apparatus for use with a semiconductor tester which inspects a plurality of devices, said tester having an input track for accepting the devices, said apparatus loading devices onto the input track, said apparatus comprising:

a plurality of elongated holding tracks being adapted to hold a plurality of semiconductor devices along said tracks;

means for loading said devices onto said holding tracks;

means for depositing the devices from the holding tracks onto the input track of the tester; and control means for controlling said depositing means to permit the devices to move from said elongated holding tracks onto the input track of the tester, and wherein said control means causes said devices loaded onto the plurality of holding tracks to be deposited from one holding track at a time onto the input track and wherein said depositing means comprising a plurality of gates, each gate controlling the release of devices onto the input track from a holding track.

6. The apparatus of claim 5, said control means controlling the sequential opening of the gates.

7. The apparatus of claim 5 wherein said depositing means includes a solenoid controlling each gate, said control means activating the solenoids to control the opening of the gates.

8. The apparatus as defined in claim 5, wherein said means for depositing includes two or more loading tracks, and wherein said control means includes a light source and an optical detector for detecting the presence and the absence of said device on a first loading track, said control means causing the depositing means to permit the devices to move from a second loading track onto the input track when there is no device in the first loading track.

9. An apparatus for use with a semiconductor tester which inspects a plurality of devices, said tester having an input track for accepting the devices, said apparatus loading devices onto the input track, said apparatus comprising:

a plurality of elongated holding tracks being adapted to hold a plurality of semiconductor devices along said tracks;

means for loading said devices onto said holding tracks;

means for depositing the devices from the holding tracks onto the input track of the tester; and control means for controlling said depositing means to permit the devices to move from said elongated holding tracks onto the input track of the tester, said depositing means further comprising a plurality of hinged tracks, each of said hinged tracks connected and corresponding to one of said elongated tracks, the position of said hinged tracks being adjustable such that each of said hinged tracks is alignable with the input track of the semiconductor tester to permit devices to pass thereon.

10. The apparatus as defined in claim 9, further comprising means for aligning each of said hinged tracks with the tester input track to permit devices to slide from such hinged track to the input track.

11. The apparatus as defined in claim 9, said aligning means comprising a plurality of hinges, each hinge connecting each of said plurality of hinged tracks to an elongated holding track, said hinges permitting the position of said hinged tracks to be adjusted in order to align each of the hinged tracks to the input track.

12. The apparatus of claim 11, said aligning means further including a plurality of solenoids, each solenoid controlling the hinge connecting one elongated holding track to a hinged track, in order to align each of the hinged tracks with the input track.

13. The apparatus of claim 12, said control means activating the solenoids sequentially to sequentially align the hinged tracks one at a time with the input track.

* * * * *